United States Patent [19]

Suganuma

[11] Patent Number: 5,662,410

[45] Date of Patent: Sep. 2, 1997

[54] LIGHT EXPOSURE AND ILLUMINATING DEVICE

[75] Inventor: Hiroshi Suganuma, Ibaragi, Japan

[73] Assignee: Sony Corporation, Tokyo, Japan

[21] Appl. No.: 504,413

[22] Filed: Jul. 20, 1995

[30] Foreign Application Priority Data

Jul. 21, 1994 [JP] Japan .................. 6-169778

[51] Int. Cl.6 .................................... F21V 5/04
[52] U.S. Cl. .................. 362/268; 362/32; 362/277; 362/331; 359/615; 359/622
[58] Field of Search .............. 355/67; 359/234, 359/599, 615, 619, 621–623, 625, 626; 362/32, 259, 268, 277, 282, 331; 372/100, 101

[56] References Cited

U.S. PATENT DOCUMENTS

| | | | |
|---|---|---|---|
| 3,407,294 | 10/1968 | Hill | 355/67 |
| 4,656,562 | 4/1987 | Sugino | 362/32 |
| 5,016,149 | 5/1991 | Tanaka et al. | 362/259 |
| 5,317,450 | 5/1994 | Kamon | 359/615 |
| 5,392,094 | 2/1995 | Kudo | 355/67 |
| 5,459,547 | 10/1995 | Shiozawa | 355/67 |

*Primary Examiner*—Alan Cariaso
*Attorney, Agent, or Firm*—Hill, Steadman & Simpson

[57] ABSTRACT

A light exposure and illuminating device in which an outgoing light of an exposure light source is supplied to a light exposure section for illuminating an object to be exposed to light. A moving scattering medium scatters a laser beam outgoing from a laser light source. A light condenser lens condenses the laser beam scattered by the moving scattering medium to a laser beam of a suitable diameter. A plurality of prisms condense the laser light condensed by the light condenser lens as a rectangle of a suitable size on an incident surface of a fly-eye lens. The fly-eye lens uniforms the intensity distribution of the laser beam in cooperation with a folding lens. Another condenser lens radiates the laser beam uniformed in intensity distribution by the fly-eye lens and the firstly-stated condenser lens as a exposure illuminating light on a mask for light exposure on which a light exposure pattern is pre-formed. With the present light exposure illuminating device, a small-sized inexpensive light source may be realized. In addition, the illuminating light is uniform and free of fluctuations or speckles, while a high light source utilization efficiency may be achieved.

5 Claims, 11 Drawing Sheets

FIG.7A

| 1 | 2 | 3 | 4 |
|---|---|---|---|
| 5 | 6 | 7 | 8 |
| 9 | 10 | 11 | 12 |
| 13 | 14 | 15 | 16 |

FIG.7B

| | 13 | 14 | 15 | 16 |
|---|---|---|---|---|
| 5 | 6 | 7 | 8 | |
| 9 | 10 | 11 | 12 | |
| | 1 | 2 | 3 | 4 |

FIG.7C

| 8/16 | 6/14 | 7/15 | 5/13 |
|---|---|---|---|
| 12/4 | 10/2 | 11/3 | 9/1 |

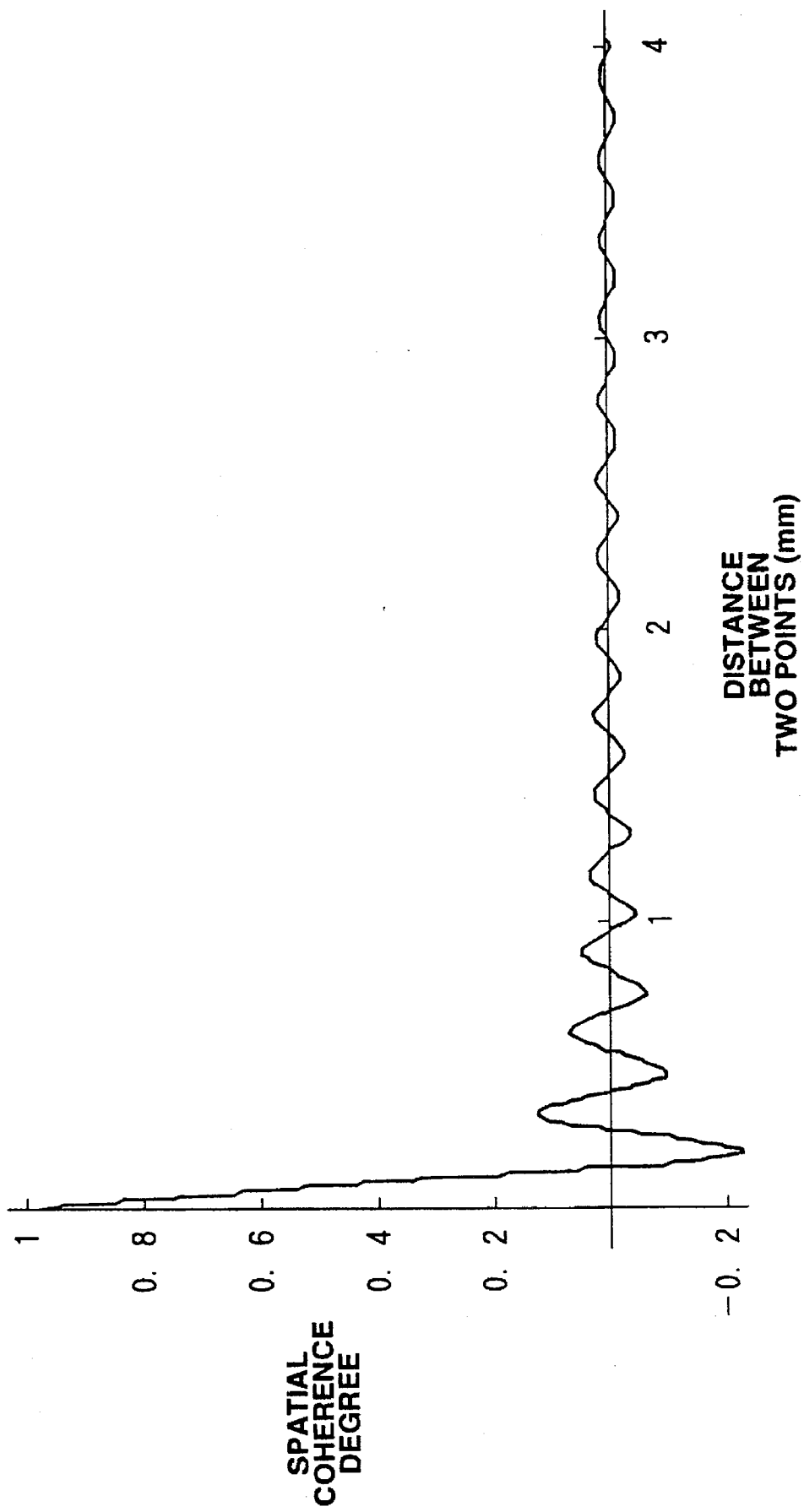

LIGHT EXPOSURE AND ILLUMINATING DEVICE

BACKGROUND OF THE INVENTION

This invention relates to a light exposure and illuminating device in which an outgoing light of an exposure light source is supplied to a site of light exposure for illuminating an object to be exposed to light.

Semiconductor or liquid crystal devices are fabricated by ultra-fine processing by photolithography. It is the lithographic device that performs the ultra-fine processing by photolithography. The lithographic device is employed widely because of its mass-producibility and low costs. In addition, the necessity for lithographic devices is felt more keenly with increase in demand for circuit integration.

In the lithographic device, it is the light exposure and illuminating device that illuminates a pattern to be recorded on a workpiece. As a light source for the light exposure and illuminating device, an i ray of a mercury lamp having a wavelength of 385 nm has been used.

The working limit of the lithographic device is inversely proportional to the wavelength of the outgoing light from a light source of a light exposure and illuminating device. In such case, it becomes necessary to maintain a depth of focus.

In any case, a variety of conditions are required of the light source of the light exposure and illuminating device. For example, the outgoing light of the slight source employed in the light exposure and illuminating device is required to have optical properties such as superior monochromaticity and incoherence. Since the outgoing light is of a short wavelength, it becomes possible to effect light exposure capable of coping with light exposure patterns of high resolution. For this reason, attempts are being made for reducing the wavelength of the outgoing light. In addition, the light source is required to be of high light output for achieving high throughput of the light exposure and illuminating device.

Among the light sources satisfying these conditions is an excimer laser. The excimer laser radiates a low-coherency laser light of multi-mode oscillation.

With the excimer laser, the laser radiating device itself is bulky in size. For actually generating the excimer laser, there is required an equipment taking up a large space such as cooling water equipment or a risky equipment handling toxic gases, thus entailing high costs in installation, management and maintenance. Since the spectral width of the excimer laser is reduced for avoiding chromatic aberration, speckles tend to be produced. In addition, the excimer laser is nonuniform in the spatial intensity distribution, such that, if such nonuniformity remains uncorrected, irregular light exposure results.

Among other light sources, there are a high-output solid laser, such as YAG, $YVO_4$, Nd-glass laser, or a high-output gas laser, such as an argon ion laser, outgoing light beams of which are converted in wavelength by wavelength converting techniques employing non-linear optics. However, high outputs on the order of several watts cannot be obtained with the laser light beams reduced in wavelength by wavelength converting techniques. Consequently, such light source, if used for a light exposure and illuminating device, leads to prolonged light exposure time and hence is thought to be unfit for mass production of semiconductor devices.

In addition, the light source, reduced in wavelength by the wavelength converting techniques, presents circular Gaussian light intensity distribution. Since most of the semiconductor light exposure devices are of a system of repeating the registration and light exposure operations, the illuminated region is preferably rectangular in view of wafer utilization efficiency. However, since the above light source presents circular Gaussian light intensity distribution, part of light needs to be "kicked" if the light beam is directly used for light exposure, thus lowering the laser light utilization efficiency.

In a conventional illuminating system of a light exposure and illuminating device, employing an excimer laser, the light intensity distributions is uniformed with the aid of a fly-eye lens 55, as shown in FIG. 1. That is, the light exposure and illuminating device, employing the conventional excimer laser, is made up of an excimer laser 51, a beam expander 52, a mirror 53 having a piezoelectric device, a reflecting mirror 54, a fly-eye lens 55, a condenser lens 56, a light exposure mask 57 having a light exposure pattern formed thereon and an objective lens 58 for imaging the transmitted light on a wafer 59 in accordance with a light exposure pattern, with a view to uniforming the spatial intensity distribution of the excimer laser. However, such uniforming technique by the fly-eye lens 55 is designed to suit to characteristics of the excimer laser, such as the rectangular intensity distribution. Consequently, such uniforming technique, if applied to a light beam having intensity distribution exhibiting high rotation symmetry, such as Gaussian distribution, leads to poor intensity distribution uniforming effects and hence to poor light source utilization efficiency.

OBJECT AND SUMMARY OF THE INVENTION

It is therefore a principal object of the present invention to provide a light exposure and illuminating device capable of emitting uniform light free from fluctuations or speckles with the use of a small-sized and inexpensive light source and capable of achieving high light source utilization efficiency.

According to the present invention, there is provided a light exposure and illuminating device having an illuminating optical system for conducting an outgoing light from a light source to a site to be exposed to light having a moving scattering medium arranged on a light path between the light source and the site to be exposed to light and having its scattering state changed, light condensing means for condensing the scattered light from the moving scattering medium, and intensity distribution uniforming means for uniforming the intensity distribution of the light condensed by the light condensing means.

The light intensity distribution uniforming means includes a plurality of prisms for refracting a peripheral portion of the light condensed by the light condensing means and a fly-eye lens on a light incident surface of which are incident the light refracted by the prisms and the light transmitted through the prisms and overlapped with each other.

The fly-eye lens is made up of a large number of rod lenses of the same shape stacked together.

The outgoing light from the light source is scattered by the moving scattering medium. The scattered light is condensed by light condensing means. Thus the light has its wave front scattered randomly. With the randomly scattered light, speckles may be prohibited from being produced even although the light is highly coherent at a time point of radiation from the light source. The intensity distribution uniforming means uniforms the intensity distribution of the light scattered by the moving scattering medium and once condensed. Thus, with the light exposure and illuminating device of the present invention, a small-sized inexpensive light source may be employed, while the exposure illuminating light is uniform and free from fluctuations or speckles and a high light source utilization efficiency may be achieved.

BRIEF DESCRIPTION OF THE DRAWINGS

FIGS. 7A, 7B and 7C illustrate uniforming of the intensity distribution with the aid of the folding prism and the fly-eye lens.

FIG. 8 illustrates uniforming of the intensity distribution with the aid of the folding prism and the fly-eye lens.

FIG. 11 is a graph showing changes in spatial coherence plotted against a distance between two points.

DESCRIPTION OF THE PREFERRED EMBODIMENTS

Figure 1:
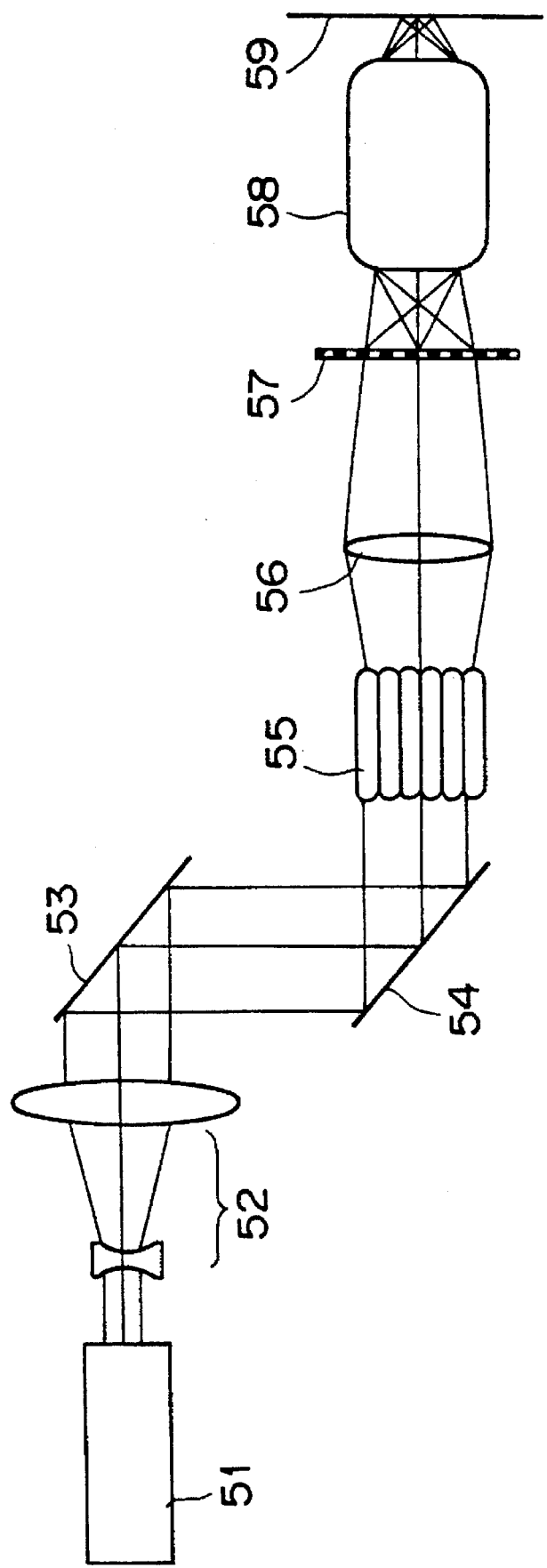
FIG. 1 is a schematic view showing a light exposure and illuminating device employing a conventional excimer laser.

Referring to the drawings, preferred embodiments of the light exposure and illuminating device according to the present invention will be explained in detail. Since the device of the present invention is configured to be able to use even a light source of high coherency, a wide variety of lasers may be employed as the exposure light source. In the illustrated embodiment, a high-coherency laser light source having high photo-electric conversion efficiency and a narrow spectral range, is employed as an exposure light source.

Figure 2:
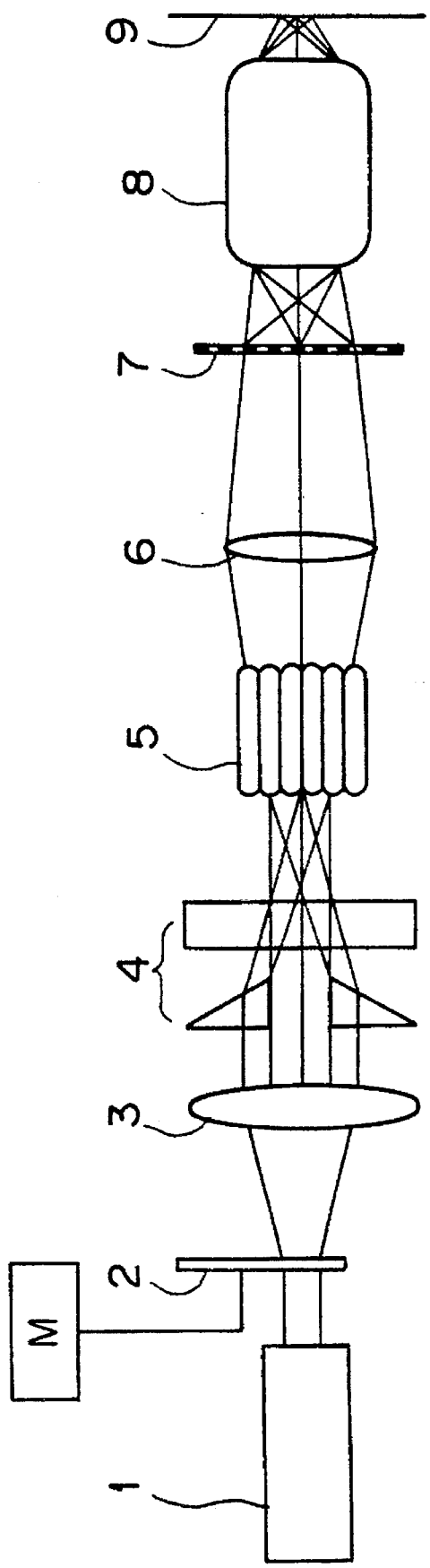
FIG. 2 is a schematic side view showing a light exposure and illuminating device according to the present invention.

Referring to FIG. 2, the light exposure and illuminating device of the illustrated embodiment includes a high-coherency laser light source 1 having high photo-electric conversion efficiency and a narrow spectral range, and a movable scattering medium 2 for scattering the laser beam radiated from the laser light source 1. The device also includes a condenser lens 3 for condensing a laser beam, scattered by the moving scattering medium 2, to a light beam of a suitable radius, and a folding prism 4 for collecting the laser beam, condensed by the condenser lens 3, in a form of a rectangle of preset side lengths, on an incident surface of a fly-eye lens 5 as later explained. The device also includes the fly-eye lens 5 for uniforming the intensity distribution of the laser beam via the folding prism 4 and a condenser lens 8 for radiating the laser beam, uniformed in intensity distribution by the fly-eye lens 5, on a light exposure mask 7 having a light exposure pattern formed thereon. The device also includes an objective lens 8 for imaging a transmitted light on a wafer 9 in accordance with the light exposure pattern formed on the light exposure mask 7. The scattered laser beam is condensed by the condenser lens 3 to a light beam having a suitable diameter.

The laser beam radiated by the laser light source 1 is scattered by the moving scattering medium 2. In this manner, the laser beam has its wave front scattered randomly. Thus the optical system employing this laser beam exhibits speckle pattern averaging effects, even although the light source exhibits high coherency, so that optimum imaging becomes possible in case of recording having time integrating effects, such as light exposure.

The moving scattering medium 2 may be implemented by, for example, a non-homogeneous phase object, such as stained glass, rotated by a rotational driving force from a motor M. The scattering effect may be directed to the transmitted light or to the reflected light, as desired. It is sufficient if random scattering may be spatially applied to the wave front of the beam or to its polarized light state.

If the laser beam has a small outgoing diameter, a laser beam of a desired diameter may be produced if the laser beam is converged after it is scattered by the moving scattering medium 2 and thereby enlarged to a suitable diameter. In the conventional system, a beam expanding optical system is required for enlarging the beam diameter. This function may be performed by a simplified arrangement consisting in the moving scattering medium 2 and the condenser lens 3.

The scattering also has the effect of low-pass filtering the spatial frequency components of the laser beam intensity distribution. That is, the scattering has the effect of correcting non-uniformity of the light source.

The laser beam condensed by the condenser 3 exhibits intensity distribution strong at the center and weak at the periphery, such as Gaussian distribution. In addition, the distribution exhibits strong rotational symmetry in a plane perpendicular to the optical axis. Thus it becomes necessary to uniform the laser beam intensity distribution. This uniformity is required to be high because it is correlated with the amount of exposure light. With the light exposure and illuminating device employing an excimer laser, the conventional practice has been to uniform the intensity distribution using a fly-eye lens designed to be matched to characteristics of the excimer laser, such as rectangular intensity distribution. However, the fly-eye lens is not sufficiently effective for a light beam exhibiting intensity distribution exhibiting global difference in intensity, such as Gaussian distribution.

Figure 3:
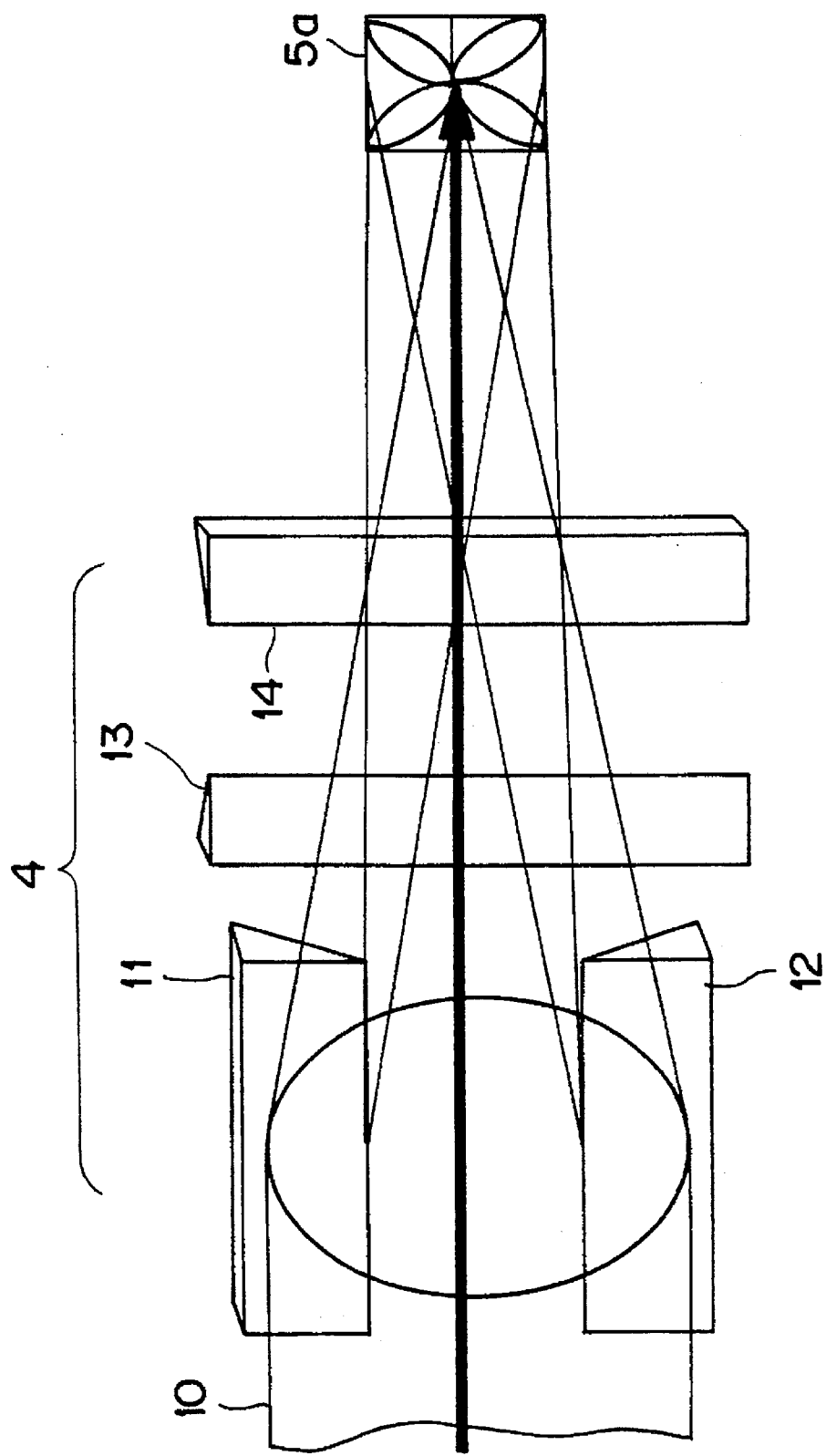
FIG. 3 shows the construction of a folding prism employed in the light exposure and illuminating device shown in FIG. 2.
Figure 4:
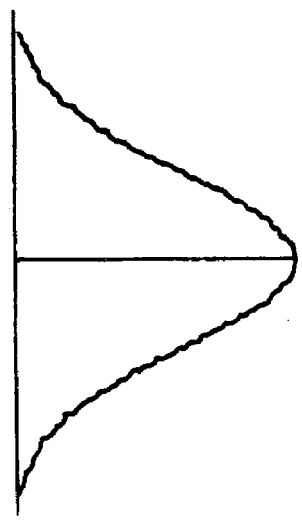
FIGS. 4A, 4B and 4C show changes in the laser beam intensity distribution.
Figure 4:
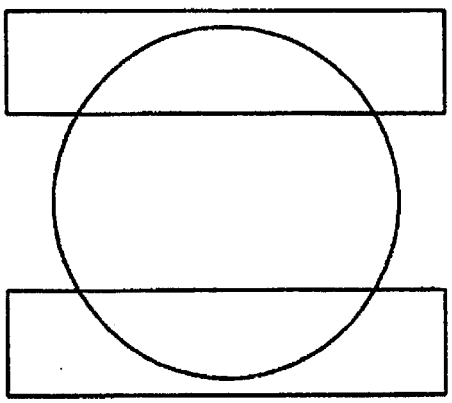
Figure 4C:
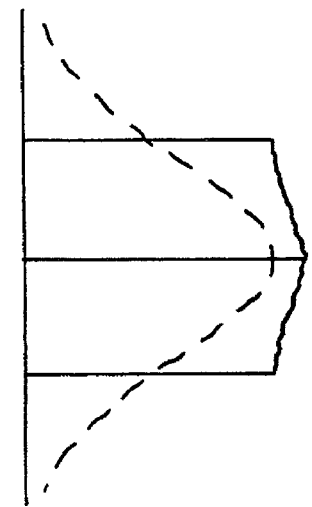

Consequently, with the light exposure and illuminating device of the illustrated embodiment, the folding prism 4 and the fly-eye lens 5 are employed for coping with the intensity distribution exhibiting global difference in intensity, such as Gaussian distribution. The folding prism 4 is comprised of prisms 11 to 14 arrayed around the laser beam 10, as shown in FIG. 3. This system refracts only the beam lying at the peripheral region of the laser beam 10. The refracted beam in the peripheral region is folded on the beam in the center region in an area illuminated by the folding prism 4, that is on an incident surface 5a of the fly-eye lens 5. If such light refraction is caused to occur from the four directions of the beam, there is produced a rectangular intensity distribution on the incident surface 5a of the fly-eye lens 5 as shown by a solid line in FIG. 4C. In addition, intensity averaging by such folding occurs simultaneously. The broken line in FIG. 4C represents the Gaussian distribution. FIGS. 4A and 4B denote the Gaussian intensity distribution of the incident light and the incident position on the prism, respectively.

The folding effect becomes maximum if the edge of the folding prism 4 within the beam 10 is at a position corresponding to about one-half (within 50±5%) of the light intensity at the center region.

Figure 5:
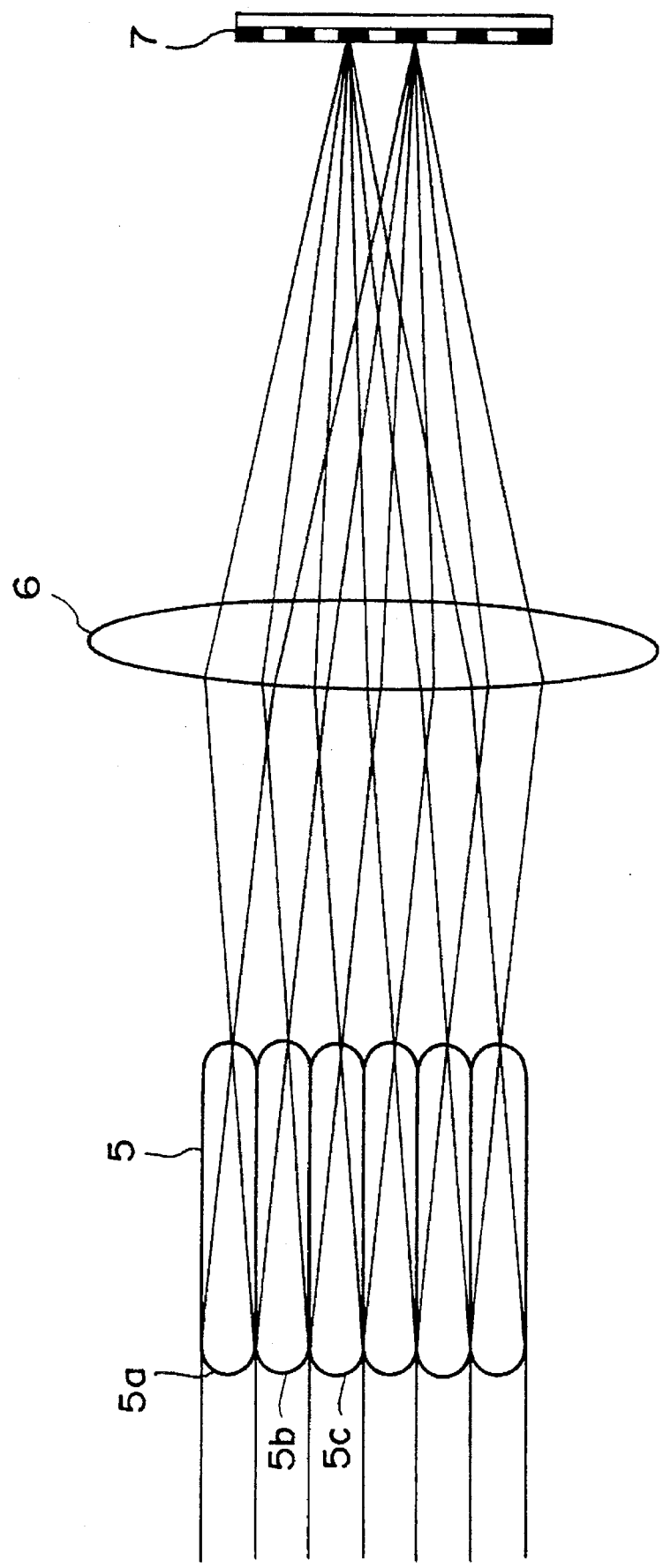
FIG. 5 is a schematic side view showing the configuration of a fly-eye lens.

The fly-eye lens 5 is a stack of a large number of rod lenses of the same shape, as shown in FIG. 5. Since the surfaces of respective elements constituting the rod lenses are enlarged or contracted and overlapped by the condenser lens 6 for constituting the illuminated area, the respective elements are each preferably of a rectangular cross-sectional configuration. The reason is that the unit area of illumination of light exposure is frequently required to be rectangular in shape in order to respond to the demand raised in connection with the repeated light exposure and device configuration. In this consideration, the rectangular configuration of illumination of the fly-eye lens 5 is ideally preferred.

Thus the use of the folding prism 4 for converting the beam configuration to a rectangular configuration is effective. Since the major portion of the light beam is caused to be incident on the fly-eye lens 5 by the configuration of the folding lens 4 and the fly-eye lens 5, the light beam utilization efficiency may be improved significantly.

The respective light incident surfaces 5a, 5b, 5c, ... of the fly-eye lens 5 and the mask light exposure 7, that is the illuminated object, are optically conjugate. That is, the images of the incident surfaces of the elements of the fly-eye lens 5 are overlapped to illuminate the mask for light exposure 7. The fly-eye lens 5 and the condenser lens 6 conjointly form a substantially bilateral telecentric optical system. That is, they conjointly radiate a collimated incident light as a collimated beam.

Figure 6:
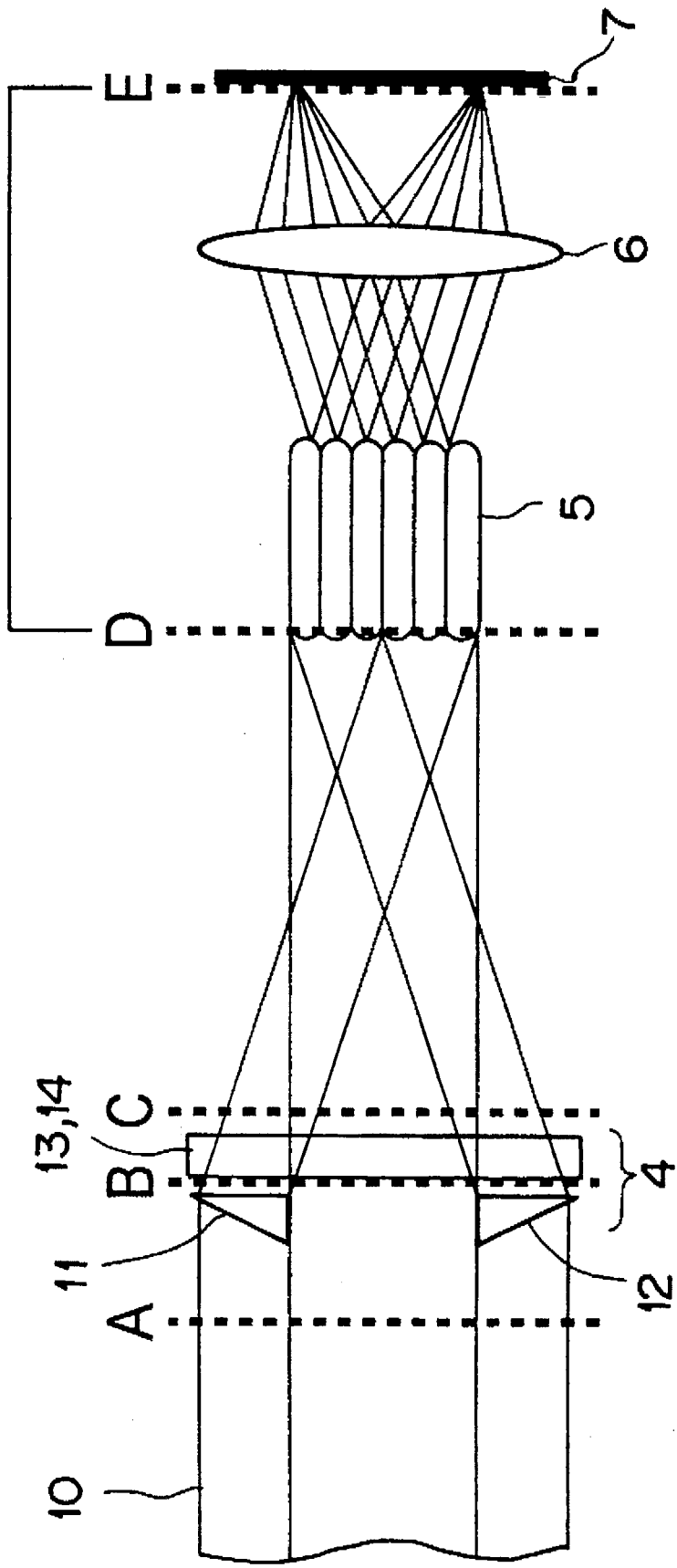

FIG. 6 shows an optical system constituted by the folding prism 4, fly-eye lens 5, condenser lens 6 and the mask for exposure 7. FIGS. 7A, 7B, 7C and FIG. 8 illustrate beam states at positions A to E shown with broken lines in FIG. 8.

Figure 8:
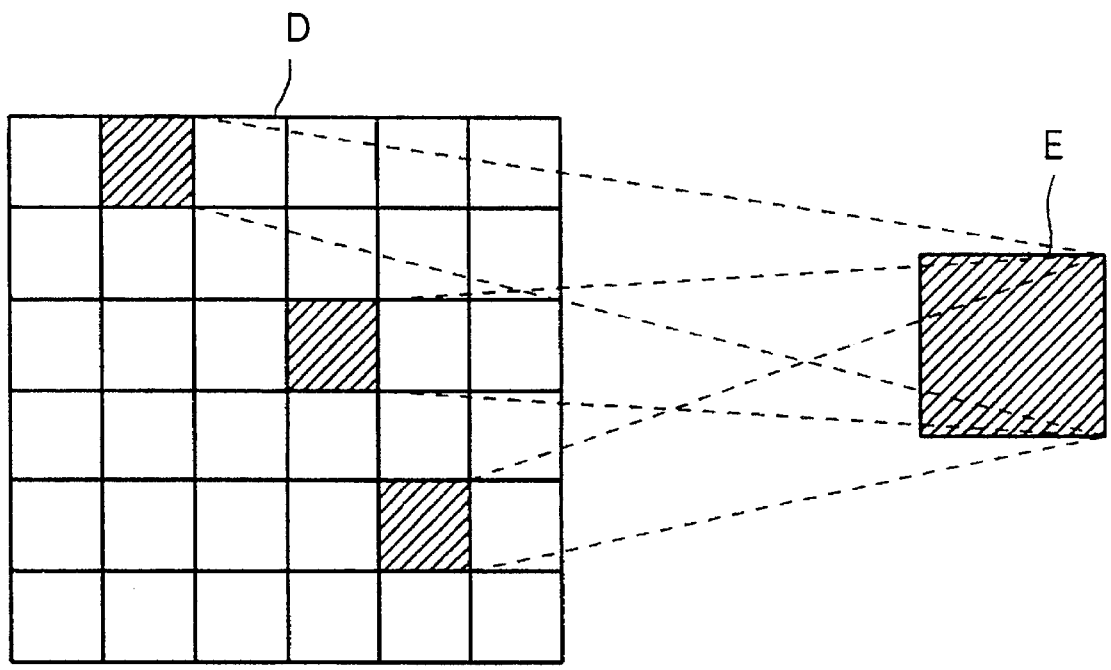
FIG. 8 is an enlarged schematic side view showing an optical system constituted by the folding prism, a fly-eye lens, a condenser lens and a light exposure mask.

That is, at the broken-line position A, prior to incidence on the folding prism 4, the laser beam 10 is distributed as schematically shown in FIG. 7A. At the broken-line position B, between the prisms 11 and 12 and between the prisms 18 and it is distributed as shown in FIG. 7B. In addition, the laser beam emanating from the folding prism 4 is distributed at the broken-line position C as shown in FIG. 7C. On the respective incident surfaces of the fly-eye lens 5 (at the broken-line position D) and at the mask for light exposure 7 (at the broken-line position E) which are optically conjugate relative to each other as described above, the images of the incident surfaces of the respective elements of the fly-eye lens 5 are overlapped to illuminate the mask for light exposure 7, as shown in FIG. 8.

Figure 9A:
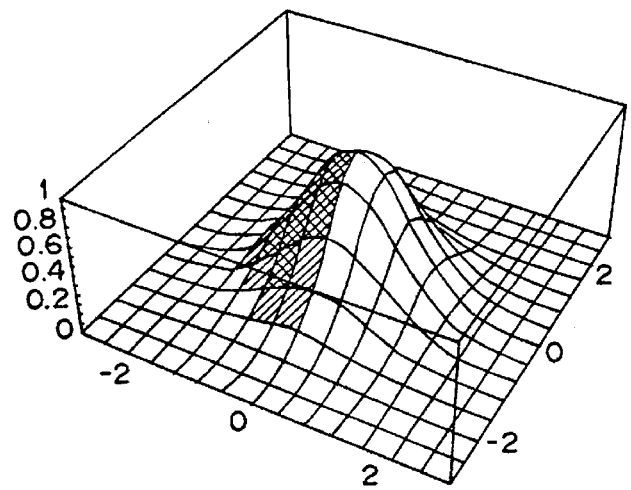
FIGS. 9A, 9B and 9C illustrate uniforming of the intensity distribution.
Figure 9B:
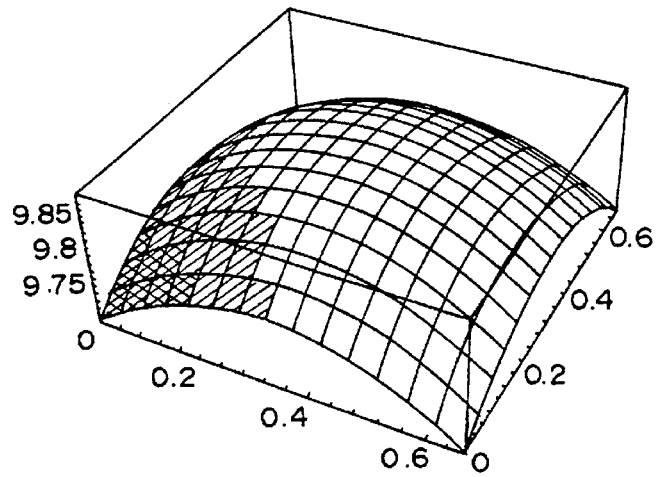
Figure 9C:
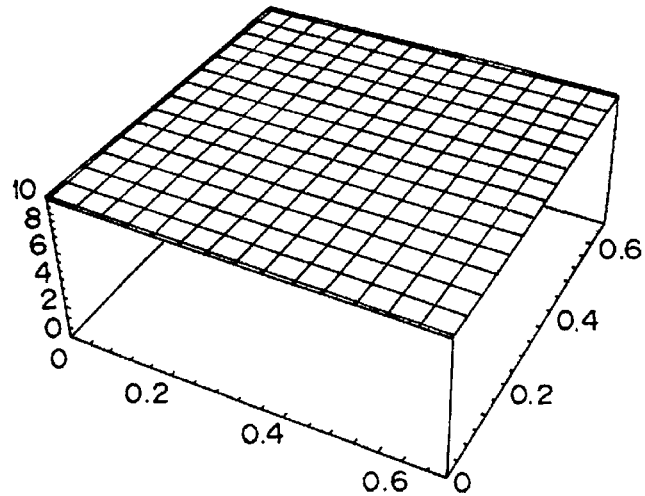

Thus it is possible with the present light exposure and illuminating device to achieve uniform intensity distribution of ±1% over the entire illuminated area, as shown in FIGS. 9B and 9C. In FIGS. 9A to 9C, the coordinates of the bottom surface represent the beam positions in the cross-sectional plane of the beam, the intensity distribution of which is shown along the height. In particular, FIG. 9A shows the intensity distribution of the incident light, while FIGS. 9B and 9C show the intensity distribution of the illuminated region after uniforming of the light intensity distribution by the fly-eye lens and the prism. In FIGS. 9B and 9C, the intensity distribution is shown in a range of from 9.7 to 9.85 and in a range of 0 to 10, respectively.

With the present light exposure and illuminating device, a small-sized inexpensive light source may be realized through the use of the moving scattering medium 2, condenser lens 3, folding prism 4 and the fly-eye lens 5. In addition, light intensity distribution is uniform and the light beam is free from fluctuations or speckles, while a high light source utilization efficiency may be achieved.

If the light beams overlapped by the operation of the folding prism 4 and the fly-eye lens 5 interfere with each other, speckles are produced to deteriorate the imaging performance. It is therefore necessary for the distance between the overlapped beams, that is the size of the respective elements of the fly-eye lens, to be separated from each other in such a manner as to sufficiently reduce the spatial coherence, as will be discussed in the following specific example.

The specific example of the light exposure and illuminating device will now be explained.

Figure 10:
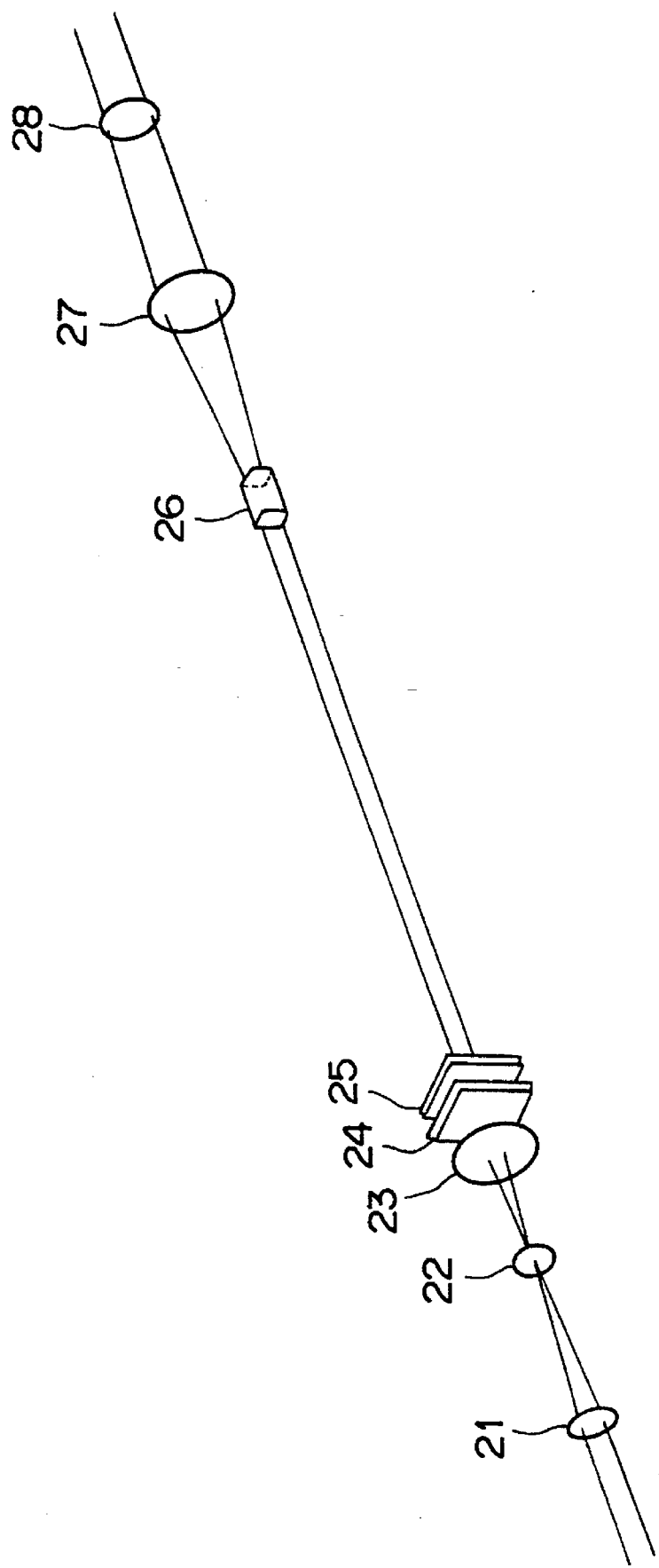
FIG. 10 is a schematic view showing an illustrative example of a light exposure and illumination device embodying the present invention.

The specific example is configured as shown in FIG. 10. There is provided a condenser lens 21 on the supposition that the incident light is the collimated light. Thus the condenser lens may be omitted if the laser beam is sufficiently small in diameter and has a sufficiently small angle of diffusion. By this condenser lens 21, the laser beam is condensed on the moving scattering medium 22. The scattered light from the moving scattering medium 22 is condensed by a condenser lens 23 and collimated to a laser beam 50 mm in diameter. This laser beam is condensed by prisms 24 and 25 as a 25 mm×25 mm sized square on the incident surface of the fly-eye lens 26. The inner portions of the prisms 24, 25 are formed of glass. However, since the laser beam transmitted through these prisms is already collimated by the condenser lens 23, the function of the prisms 24 and 25 is in no way different from that of the above-mentioned folding prism 4.

The fly-eye lens 26 is formed by a large number of element lenses, such as rod lenses. The manner in which the diameter of the element lenses is determined in now explained.

If there is left any coherency between the elements, interference results. Thus the respective elements need to be separated sufficiently from one another. In this consideration, respective points of scattering particles on the moving scattering medium 2 are assumed to be light sources having no correlation relative to one another. Microscopical observation reveals that the size of the respective particles of the moving scattering medium 2 is on the order of several to tens of microns. If the light beam 1 mm in diameter is converged on the scattering medium 22 by a lens having a focal length of 138 mm, a spot 44 μm is produced. Surface irregularities on the moving scattering medium 22 are negligible because of a larger value of the depth of focus. If the spot is deemed a light source having a radius a, the complex degree of coherence μ (x, x') between two points (x, x') on the cross-sectional surface of the collimated light beam is represented by the following equation:

$$\mu(x,x') = \frac{\sin\left(\frac{4\pi a \xi 0}{\lambda}\right)}{\frac{4\pi a \xi 0}{\lambda}} \quad (1)$$

where ζ is the number of apertures of illumination.

FIG. 11 shows the relation between the distance between the two points (x, x') and the degree of spatial coherence. Since the degree of spatial coherence substantially converges to zero for the distance between two points of 4 mm, the diameter of the element lens of the fly-eye lens in the specific example of FIG. 9 is set to 4 mm.

The laser beam from the fly-eye lens 26 is incident on a condenser lens 27, which enlarges the size of the incident surfaces of the respective 4 mm×4 mm elements of the fly-eye lens 26 by a factor of four and forms an image of the laser beam as a 24 mm×24 mm square on a mask for light exposure 28. The transmitted light formed on the mask for light exposure 28 in accordance with the light exposure pattern is imaged on a wafer, not shown, via an objective lens, also not shown. The light refracted by the prisms 24 and 25 are configured to be not "kicked" within the inside of the fly-eye lens 26.

With the present specific example, a small-sized inexpensive light source may similarly be realized through the use of the moving scattering medium 22, condenser lens 23, folding prism 24 and the fly-eye lenses 25, 26. In addition, light intensity distribution is uniform and the light beam is free from fluctuations or speckles, while a high light source utilization efficiency may be achieved.

The present invention is not limited to the above-described specific embodiments of the light exposure and illuminating device. For example, if the imaging optical system exhibits incident angle dependency with respect to the illuminating light, a field lens may be optionally provided in the vicinity of the object to be illuminated for adjusting the angle of the light transmitted through the object with respect to the optical axis.

What is claimed is:

1. A light exposure and illuminating device having an illuminating optical system for conducting an outgoing light from a light source to a portion to be exposed to light, comprising:

a moving scattering medium arranged on a light path between the light source and the portion to be exposed to light, said scattering medium continuously randomly scattering a light wave front passing therethrough;

light condensing means for condensing the scattered light from the moving scattering medium; and intensity distribution uniforming means for uniforming the intensity distribution of the light condensed by said light condensing means.

2. A light exposure and illuminating device having an illuminating optical system for conducting an outgoing light from a light source to a portion to be exposed to light, comprising:

a moving scattering medium arranged on a light path between the light source and the portion to be exposed to light, said scattering medium continuously randomly scattering a light wave front passing therethrough;

light condensing means for condensing the scattered light from the moving scattering medium; and intensity distribution uniforming means for uniforming the intensity distribution of the light condensed by said light condensing means;

wherein said light intensity distribution uniforming means includes a plurality of prisms for refracting a peripheral portion of the light condensed by said light condensing means and a fly-eye lens on a light incident surface of which are incident the light refracted by said prisms and the light transmitted through said prisms and overlapped with each other.

3. The light exposure and illuminating device as claimed in claim 2, wherein said fly-eye lens is made up of a large number of rod lenses of the same shape stacked together.

4. The light exposure and illuminating device as claimed in claim 1, wherein said light intensity distribution uniforming means includes a plurality of prisms for refracting a peripheral portion of the light condensed by said light condensing means and a fly-eye lens on a light incident surface of which are incident the light refracted by said prisms and the light transmitted through said prisms and overlapped with each other.

5. The light exposure and illuminating device is claimed in claim 4, wherein said fly-eye lens is made up of a large number of rod lenses of the same shape stacked together.

* * * * *